United States Patent
Nagaya et al.

(10) Patent No.: US 11,810,821 B2
(45) Date of Patent: Nov. 7, 2023

(54) SEMICONDUCTOR CHIP AND METHOD FOR MANUFACTURING THE SAME

(71) Applicants: DENSO CORPORATION, Kariya (JP); HAMAMATSU PHOTONICS K.K., Hamamatsu (JP); National University Corporation Tokai National Higher Education and Research System, Nagoya (JP)

(72) Inventors: Masatake Nagaya, Kariya (JP); Kazukuni Hara, Kariya (JP); Daisuke Kawaguchi, Hamamatsu (JP); Toshiki Yui, Hamamatsu (JP); Chiaki Sasaoka, Nagoya (JP); Jun Kojima, Nagoya (JP); Shoichi Onda, Nagoya (JP)

(73) Assignees: DENSO CORPORATION, Kariya (JP); HAMAMATSU PHOTONICS K.K., Hamamatsu (JP); National University Corporation Tokai National Higher Education and Research System, Nagoya (JP)

( * ) Notice: Subject to any disclaimer, the term of this patent is extended or adjusted under 35 U.S.C. 154(b) by 126 days.

(21) Appl. No.: 17/229,137

(22) Filed: Apr. 13, 2021

(65) Prior Publication Data
US 2021/0327757 A1 Oct. 21, 2021

(30) Foreign Application Priority Data
Apr. 15, 2020 (JP) .................................. 2020-073157

(51) Int. Cl.
*H01L 21/78* (2006.01)
*H01L 29/20* (2006.01)
(Continued)

(52) U.S. Cl.
CPC .......... *H01L 21/78* (2013.01); *H01L 21/0254* (2013.01); *H01L 21/02389* (2013.01);
(Continued)

(58) Field of Classification Search
CPC ............... H01L 21/78; H01L 21/02389; H01L 21/0254; H01L 21/268; H01L 29/0657; H01L 29/2003
See application file for complete search history.

(56) References Cited

U.S. PATENT DOCUMENTS

2002/0096994 A1\* 7/2002 Iwafuchi ............. H01L 21/2007 257/E27.111
2019/0232433 A1 8/2019 Kitamura et al.
(Continued)

FOREIGN PATENT DOCUMENTS

JP 2016-207908 A 12/2016

OTHER PUBLICATIONS

U.S. Appl. No. 17/229,141, filed Apr. 13, 2021, Sasaoka et al..
U.S. Appl. No. 17/229,356, filed Apr. 13, 2021, Kojima et al..

*Primary Examiner* — Jay C Kim
*Assistant Examiner* — Woo K Lee
(74) *Attorney, Agent, or Firm* — POSZ LAW GROUP, PLC

(57) ABSTRACT

A semiconductor chip includes: an epitaxial film made of gallium nitride; a semiconductor element disposed in the epitaxial film; a chip formation substrate including the epitaxial film and having a first surface, a second surface opposite to the first surface, and a side surface connecting the first surface and the second surface; and a convex and a concavity on the side surface.

6 Claims, 7 Drawing Sheets

(51) Int. Cl.
  *H01L 21/268*   (2006.01)
  *H01L 21/02*    (2006.01)
  *H01L 29/06*    (2006.01)
(52) U.S. Cl.
  CPC ........ *H01L 21/268* (2013.01); *H01L 29/0657* (2013.01); *H01L 29/2003* (2013.01)

(56) References Cited

U.S. PATENT DOCUMENTS

2020/0180082 A1    6/2020  Tanaka et al.
2021/0066547 A1*   3/2021  Doan .................... H01L 33/44

* cited by examiner

SEMICONDUCTOR CHIP AND METHOD FOR MANUFACTURING THE SAME

CROSS REFERENCE TO RELATED APPLICATION

The present application claims the benefit of priority from Japanese Patent Application No. 2020-073157 filed on Apr. 15, 2020. The entire disclosure of the above application is incorporated herein by reference.

TECHNICAL FIELD

The present disclosure relates to a semiconductor chip in which a semiconductor element is formed on a chip constituent substrate including gallium nitride (hereinafter, also simply referred to as GaN), and a method for manufacturing the same.

BACKGROUND

Conventionally, a manufacturing method for manufacturing the semiconductor chip has been proposed in which an epitaxial film is formed on a semiconductor wafer to form a processed wafer, a semiconductor element is formed on the processed wafer, and then the processed wafer is divided into semiconductor chips. Specifically, in this manufacturing method, assuming that the surface of the processed wafer on the epitaxial film side is one surface and the surface of the processed wafer on the semiconductor wafer side is the other surface, first, a one surface side element component for providing a part of the semiconductor element such as a diffusion layer and a surface electrode is formed on one surface side of the processed wafer. Next, the other surface side of the processed wafer is ground to a predetermined thickness, and the other surface side element component for providing the other surface side part of the semiconductor element such as the back surface electrode is formed on the other surface side of the processed wafer. After that, the processed wafer is divided into chips as a unit.

SUMMARY

According to an example, a semiconductor chip includes: an epitaxial film made of gallium nitride; a semiconductor element disposed in the epitaxial film; a chip formation substrate including the epitaxial film and having a first surface, a second surface opposite to the first surface, and a side surface connecting the first surface and the second surface; and a convex and a concavity on the side surface.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1A:
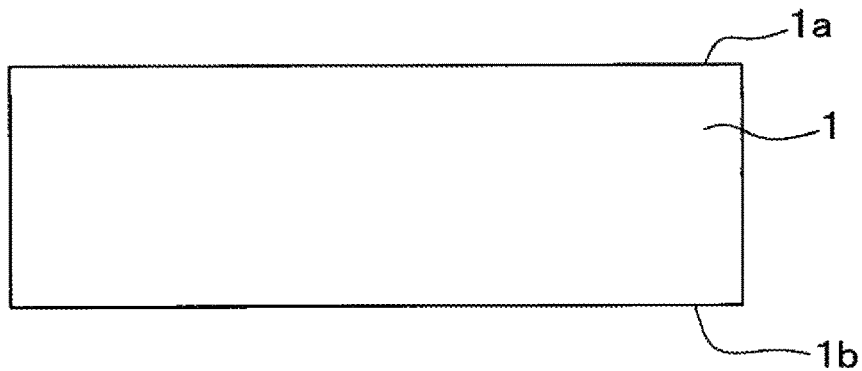
FIG. 1A is a cross-sectional view showing a manufacturing process of a semiconductor chip according to the first embodiment.

The present inventors are studying a semiconductor chip using a chip-constituting substrate including GaN, which has advantages such as a wide bandgap and a large electron saturation rate. Then, when such a semiconductor chip is manufactured by using the above manufacturing method, it becomes as follows.

That is, a GaN wafer is prepared as a semiconductor wafer, and an epitaxial film made of GaN is grown on the GaN wafer to form a processed wafer. Then, after forming the element component on one side of the processed wafer, grinding is performed from the other surface of the processed wafer. After that, the other surface side element portion is formed, and the processed wafer is divided into chips.

However, in this manufacturing method, the processed wafer is ground from the other surface. That is, the GaN wafer is ground. Therefore, it is necessary to prepare a GaN wafer every time a semiconductor chip is manufactured, which may reduce productivity.

In view of the above points, a semiconductor chip capable of improving productivity and a method for manufacturing the same are provided.

According to an aspect of example embodiments, a method of manufacturing a semiconductor chip on which a semiconductor element is formed includes: preparing a GaN wafer made of GaN and having one surface and another surface; forming an epitaxial film on one surface of the GaN wafer to define a surface on an epitaxial film side as the one surface and another surface on a GaN wafer side as the other surface and to provide a processed wafer having a plurality of chip formation regions on the one surface of the GaN wafer; forming a one-surface side element component of the semiconductor element in the plurality of chip formation regions; arranging a holding member on one surface side of the processed wafer; forming a division structure for dividing or supporting a division of the chip formation regions; after forming the division structure, forming a wafer transformation layer, in which a nitrogen atom is separated from a gallium atom and discharged from the division structure, along a surface direction of the processed wafer by irradiating a laser beam on an inside of the processed wafer from the other surface side of the processed wafer; dividing the processed wafer into a chip formation wafer on the one surface side of the processed wafer and a recycle wafer on the other surface side of the processed wafer by separating the processed wafer at the wafer transformation layer as a boundary; forming an other surface side element component of the semiconductor element on another surface of the chip formation wafer which is separated from the recycle wafer; retrieving the semiconductor chip from the chip formation wafer; and recycling the recycle wafer as a GaN wafer.

According to this method, the processed wafer is divided into a chip formation wafer and a recycle wafer, and the recycle wafer is used again as a GaN wafer. Therefore, it is not necessary to newly prepare a GaN wafer every time a semiconductor chip is manufactured, and the GaN wafer can be effectively used. Therefore, the productivity of the semiconductor chip can be improved.

Further, when forming the wafer transformation layer, the nitrogen atom is released from the division structure. Therefore, it is possible to reduce the distortion generated in each chip formation region when forming the wafer transformation layer, and it is possible to suppress the occurrence of defects in the semiconductor chip.

Further, according to an aspect of an example embodiment, a semiconductor chip has an epitaxial film made of GaN and a semiconductor element formed thereon. The chip includes a chip formation substrate with an epitaxial film having one surface, another surface on the opposite side to the one surface, and a side surface connecting the one surface and the other surface. A concavity and convexity is formed on the side surface.

According to this, the side surface of the semiconductor chip is in a state where unevenness is formed. Therefore, the handling of the semiconductor chip can be facilitated.

The reference numerals in parentheses attached to the components and the like indicate an example of correspondence between the components and the like and specific components and the like in an embodiment to be described below.

Hereinafter, embodiments of the present disclosure will be described with reference to the drawings. In the following embodiments, the same reference numerals are assigned to parts that are the same or equivalent to each other to describe the same.

First Embodiment

A first embodiment will be described with reference to the drawings. Hereinafter, a method for manufacturing a semiconductor chip 100 in which a semiconductor element is formed on a chip formation substrate 110 including GaN will be described.

First, as shown in FIG. 1A, a GaN wafer 1 having one surface 1a and another surface 1b and having a bulk wafer shape is prepared. For example, as the GaN wafer 1, a wafer in which silicon, oxygen, germanium or the like is doped and the impurity concentration is $5 \times 10^{17}$ cm$^{-3}$ to $5 \times 10^{19}$ cm$^{-3}$ is used. The thickness of the GaN wafer 1 may be arbitrary, for example, a wafer having a thickness of about 400 μm is prepared. In the GaN wafer 1 of the present embodiment, one surface 1a is a Ga surface and the other surface 1b is an N surface. Further, the GaN wafer 1 is prepared by recycling the recycle wafer 40 of FIG. 1J, which will be described later, after the manufacturing process of the semiconductor chip 100 described below is performed. Then, if necessary, a protection film made of an oxide film or the like may be formed on the other surface 1b or the like of the GaN wafer 1.

Figure 1B:
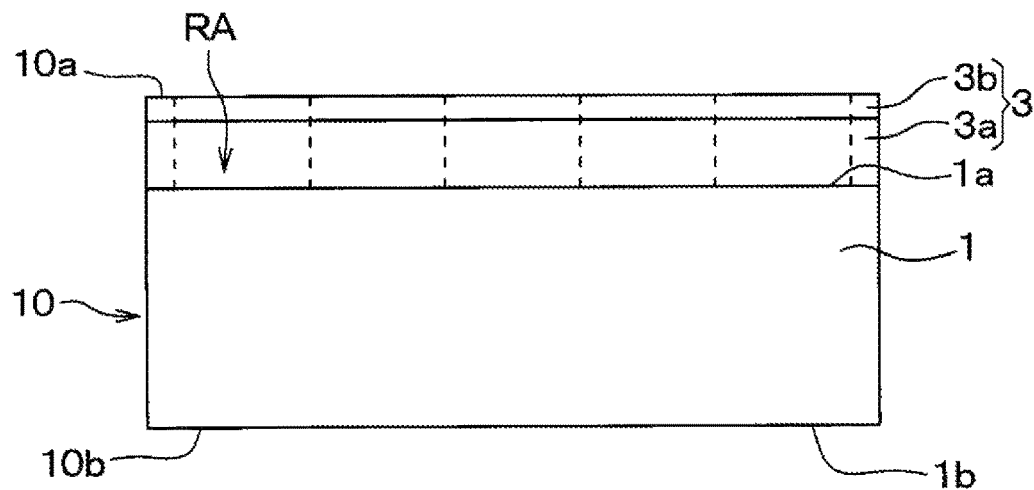
FIG. 1B is a cross-sectional view illustrating a manufacturing process of the semiconductor device subsequent to FIG. 1A.

Next, as shown in FIG. 1B, a processed wafer 10 having a plurality of chip formation regions RA is prepared by forming an epitaxial film 3 made of GaN with a thickness of about 10 μm to 60 μm on the one surface 1a of the GaN wafer 1. In the present embodiment, the epitaxial film 3 is formed by depositing an n$^+$ type epitaxial layer 3a and an n$^-$ type epitaxial layer 3b in order from the GaN wafer 1 side. For example, the n$^+$ type epitaxial layer 3a is doped with silicon, oxygen, germanium, etc., and has an impurity concentration of about $5 \times 10^{17}$ cm$^{-3}$ to $1 \times 10^{18}$ cm$^{-3}$. Silicon or the like is doped in the n$^-$ type epitaxial layer 3b, and the impurity concentration is about $1 \times 10^{17}$ cm$^{-3}$ to $4 \times 10^{17}$ cm$^{-3}$.

The n$^-$ type epitaxial layer 3b is a portion on which the one surface side element component 11 such as the diffusion layer 12, which will be described later, is formed, and has a thickness of, for example, about 8 μm to 10 μm. The n$^+$ type epitaxial layer 3a is a portion for securing the thickness of the semiconductor chip 100 described later, and the thickness is, for example, about 40 μm to 50 μm. The thickness of the n$^+$ type epitaxial layer 3a and the thickness of the n$^-$ type epitaxial layer 3b may be arbitrary, for example, here, the n$^+$ type epitaxial layer 3a is thicker than the n$^-$ type epitaxial layer 3b so as to secure the thickness of the semiconductor chip 100. In the following, the surface of the processed wafer 10 on the epitaxial film 3 side is referred to as one surface 10a of the processed wafer 10, and the surface of the processed wafer 10 on the GaN wafer 1 side is referred to as the other surface 10b of the processed wafer 10. Each chip formation region RA is disposed on the side of the one surface 10a of the processed wafer 10.

Figure 1C:
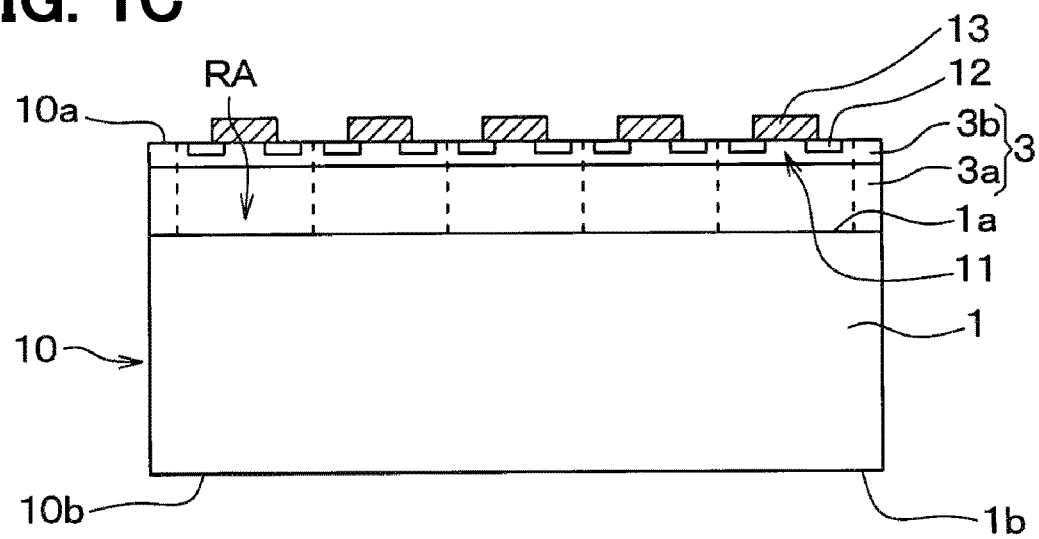
FIG. 1C is a cross-sectional view illustrating a manufacturing process of the semiconductor device subsequent to FIG. 1B.

Next, as shown in FIG. 1C, a general semiconductor manufacturing process is performed, and a step for forming the one surface side element component 11 of the semiconductor element such as a diffusion layer 12 and a gate electrode 13 and a surface electrode, a wiring pattern and a passivation film not shown is performed in each chip formation region RA. As the semiconductor element here, those having various configurations are adopted, for example, a power device such as a high electron mobility transistor (HEMT: an abbreviation for High Electron Mobility Transistor) and an optical semiconductor element such as a light emitting diode are adopted. After that, if necessary, a surface protection film made of a resist or the like is formed on one surface 10a side of the processed wafer 10.

Figure 1D:
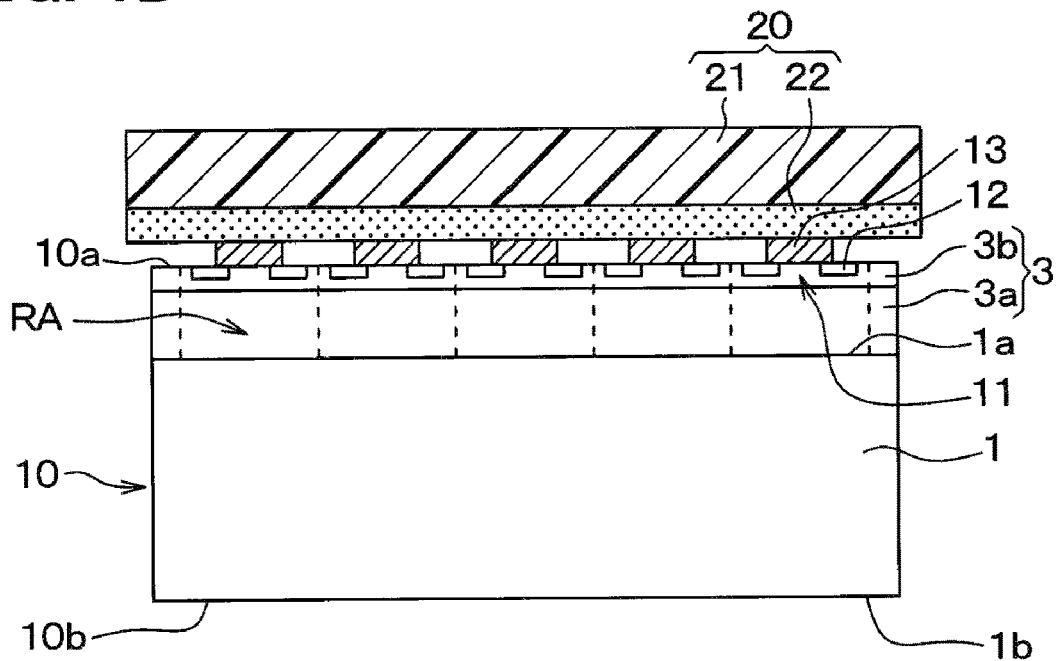
FIG. 1D is a cross-sectional view illustrating a manufacturing process of the semiconductor device subsequent to FIG. 1C.

Subsequently, as shown in FIG. 1D, the holding member 20 is arranged on the one surface 10a side of the processed wafer 10. As the holding member 20, for example, a dicing tape or the like having a base material 21 and an adhesive 22 is used. The base material 21 is made of a material that does not easily warp during the manufacturing process, and is made of, for example, glass, a silicon substrate, ceramics, or the like. The adhesive 22 is made of a material whose adhesive strength can be changed. For example, an adhesive whose adhesive strength changes depending on temperature or light is used. In this case, the adhesive 22 is made of, for example, an ultraviolet curable resin, wax, double-sided tape, or the like. Here, the adhesive 22 may be made of a material that maintains the adhesive force even when the other surface side element component 60 of FIG. 1H, which will be described later, is formed.

Figure 1E:
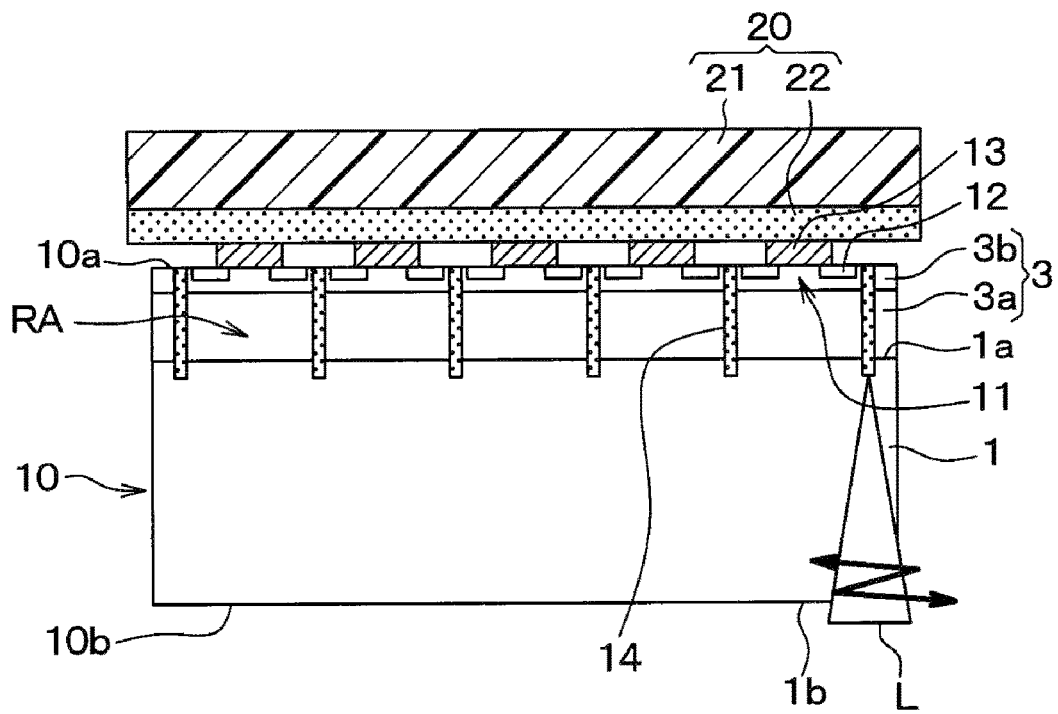
FIG. 1E is a cross-sectional view illustrating a manufacturing process of the semiconductor device subsequent to FIG. 1D.
Figure 2:
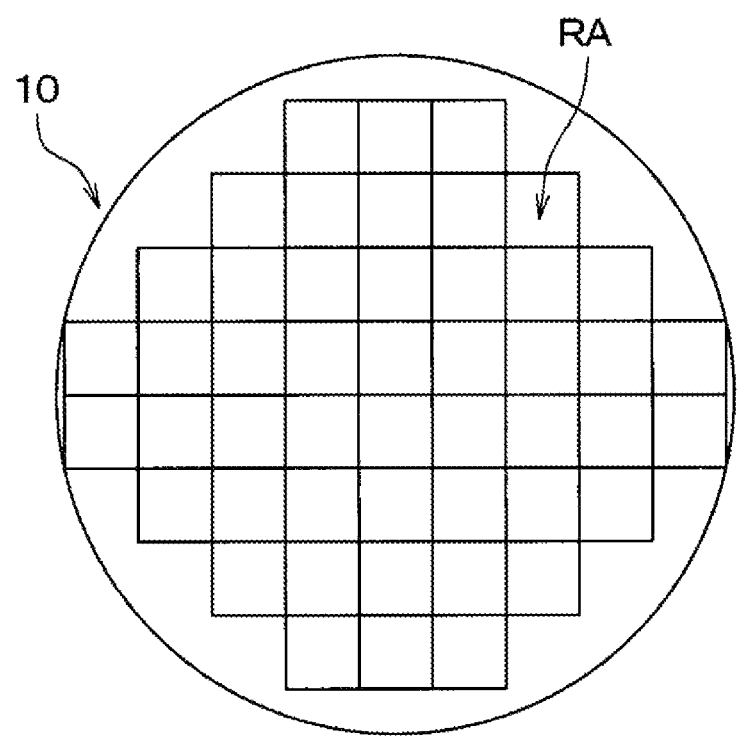
FIG. 2 is a schematic view of a processed wafer.

Next, as shown in FIG. 1E, the laser beam L is irradiated from the other surface 10b of the processed wafer 10, and the chip transformation layer 14 is formed on the outer edge including the boundary of each chip formation region RA. In the present embodiment, as shown in FIG. 2, each chip formation region RA has a rectangular shape. Further, in the present embodiment, the chip transformation layer 14 corresponds to the decomposition structure.

Specifically, a laser device is prepared with a laser light source that oscillates the laser beam L, a dichroic mirror arranged so as to change the direction of the optical axis (that is, the optical path) of the laser beam, a condensing lens (that is, a condensing optical system) for condensing the laser beam, a displaceable stage, and the like. Then, when forming the chip transformation layer 14, the processed wafer 10 is placed on the stage and the position of the stage or the like is adjusted so that the focusing point of the laser beam L is relatively scanned along the outer edge of each chip formation region RA.

As a result, on the outer edge of each chip formation region RA, a chip transformation layer 14 in which gallium and nitrogen are decomposed by thermal energy is formed. More specifically, by irradiating the laser beam L, the chip transformation layer 14 is formed in which the nitrogen atom evaporates as a gas and the gallium atom is separated. The chip transformation layer 14 is in a state in which fine pores are formed by discharging the nitrogen atom. Further, the chip transformation layer 14 is common between adjacent chip formation regions RA at the boundary of each chip formation regions RA. That is, in the portion where the chip formation region RA is adjacent, the chip transformation layer 14 is formed along the boundary of the chip formation region RA.

Further, in the present embodiment, when forming the chip transformation layer 14, the stage or the like is appropriately displaced, and at the outer edge of each chip formation region RA, the laser beam L is irradiated so as to displace the focusing point to multiple spots equal to or more than two different locations in a thickness direction of the processed wafer 10. In this case, the chip transformation layers 14 are formed at different locations in the thickness direction of the processed wafer 10. Each chip transformation layer 14 may be separated from each other or may be connected to each other. Further, when the condensing point is moved to two or more different locations in the thickness direction of the processed wafer 10, the condensing point is moved from one surface 10a side of the processed wafer 10 to the other surface 10b side.

In the chip transformation layer 14, when the wafer transformation layer 15 shown in FIG. 1F, which will be described later, is formed, nitrogen generated by forming the wafer transformation layer 15 is discharged to the outside through the pores of the chip transformation layer 14. Further, although not particularly limited, in the present embodiment, when forming the chip transformation layer 14, a solid-state laser beam having a wavelength of 532 nm of a green color laser beam is used as the laser beam L. The laser beam L is irradiated with a processing point output of 2 µJ, a pulse width of 500 ps, and a processing speed of 500 mm/s. Here, these conditions are only one example, and the present inventors confirm that the chip transformation layer 14 can be formed appropriately even when the processing point output of the laser beam L is further lower or the pulse width is further shorter. Further, the present inventors confirm that the chip transformation layer 14 is appropriately formed even when the processing point output of the laser beam L is higher or the pulse width is longer.

Figure 1F:
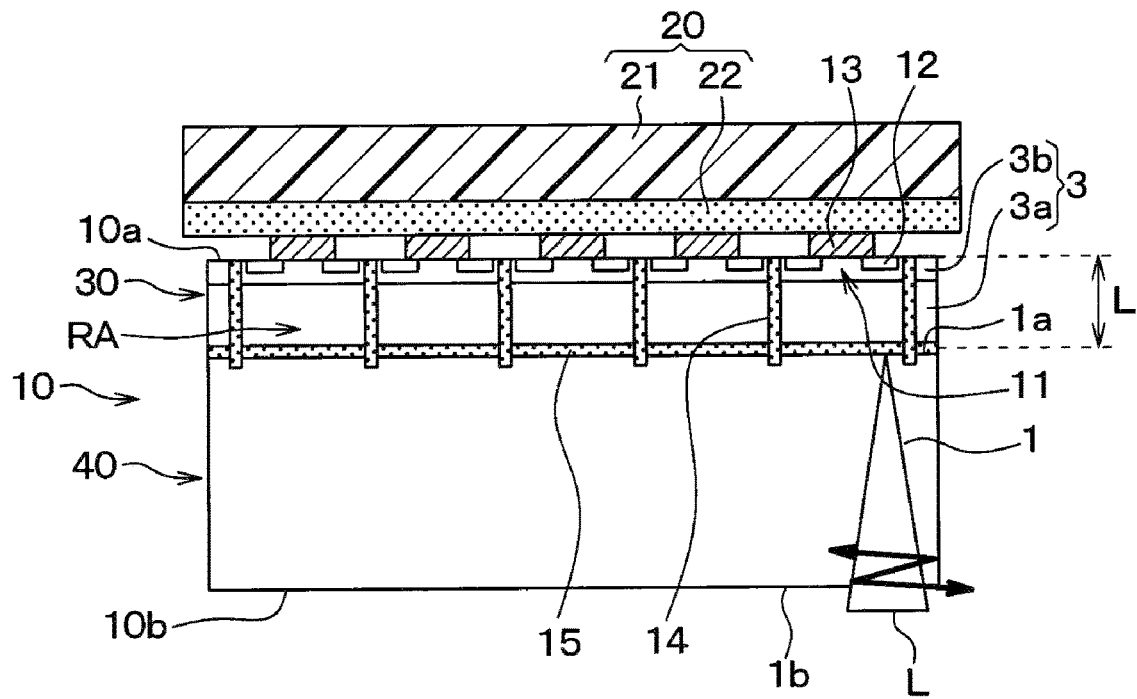
FIG. 1F is a cross-sectional view illustrating a manufacturing process of the semiconductor device subsequent to FIG. 1E.

Subsequently, as shown in FIG. 1F, the laser beam L is irradiated from the other surface 10b of the processed wafer 10, and the wafer transformation layer 15 is formed at a position with a predetermined depth L from the one surface 10a of the processed wafer 10 along the surface direction of the processed wafer 10. In the present embodiment, the wafer transformation layer 15 is formed by using the laser apparatus used for forming the chip transformation layer 14.

Then, when the wafer transformation layer 15 is formed, the position of the stage or the like is adjusted so that the condensing point of the laser beam L is relatively scanned along the surface direction of the processed wafer 10. As a result, the wafer transformation layer 15 is formed on the processed wafer 10 along the surface direction. The wafer transformation layer 15 has a configuration in which nitrogen evaporates as a gas and gallium is precipitated, similarly to the chip transformation layer 14.

In this case, in the present embodiment, the wafer transformation layer 15 is formed so as to intersect the chip transformation layer 14 or pass directly under the chip transformation layer 14. Thereby, in the present embodiment, it is possible to suppress the application of a large distortion to each chip formation region RA when the wafer transformation layer 15 is formed.

Figure 3A:
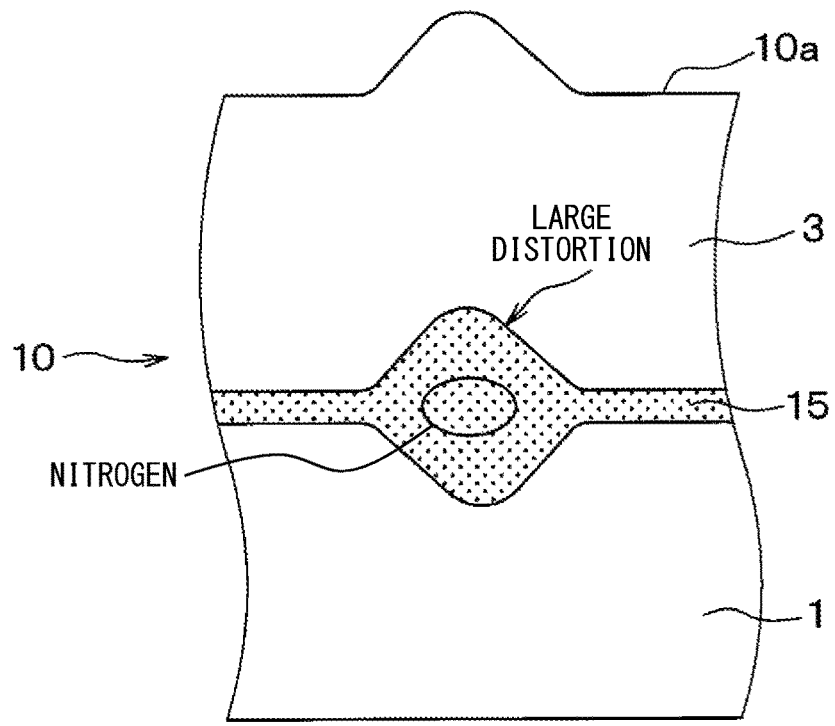
FIG. 3A is a schematic view showing a case where a wafer transformation layer is formed without forming a chip transformation layer.
Figure 3B:
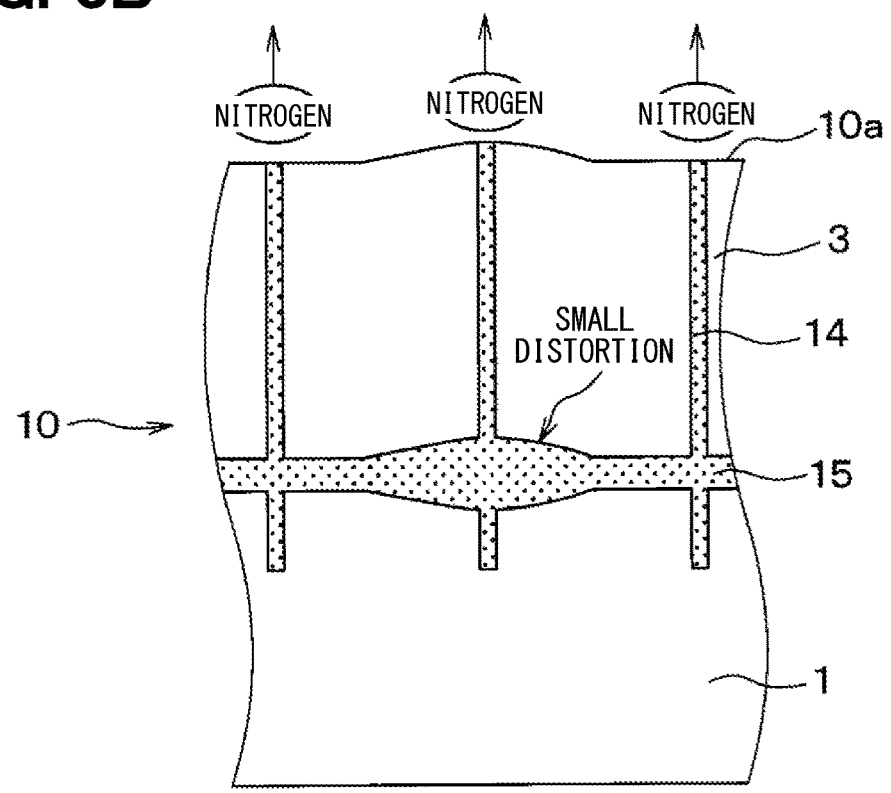
FIG. 3B is a schematic view of a case where a wafer transformation layer is formed after the chip transformation layer is formed.

That is, when the chip transformation layer 14 is not formed, as shown in FIG. 3A, the nitrogen generated when the wafer transformation layer 15 is formed is difficult to be released to the outside, so that the distortion of the processed wafer 10 due to the formation of the wafer transformation layer 15 tends to increase. On the other hand, in the present embodiment, the chip transformation layer 14 is formed, and the wafer transformation layer 15 is formed so as to intersect the chip transformation layer 14 or pass directly under the chip transformation layer 14. Therefore, as shown in FIG. 3B, nitrogen generated when the wafer transformation layer 15 is formed is easily released to the outside through the pores of the chip transformation layer 14. Therefore, it is possible to suppress an increase in the strain of the processed wafer 10 due to the formation of the wafer transformation layer 15, and it is possible to reduce the strain applied to each chip formation region RA.

Further, although not particularly limited, in the present embodiment, when forming the wafer transformation layer 15, a solid-state laser beam having a wavelength of 532 nm of a green color laser beam is used as the laser beam L. The laser beam L is irradiated with a processing point output of 0.1 µJ to 0.3 µJ, a pulse width of 500 ps, and a processing speed of 50 mm/s to 500 mm/s. Here, these conditions are only one example, and the present inventors confirm that the wafer transformation layer 15 can be formed appropriately even when the processing point output of the laser beam L is further lower or the pulse width is further shorter. Further, the present inventors confirm that the wafer transformation layer 15 is appropriately formed even when the processing point output of the laser beam L is higher or the pulse width is longer.

Further, the predetermined depth L when forming the wafer transformation layer 15 is set according to the ease of handling of the semiconductor chip 100, the withstand voltage, and the like, and is about 10 µm to 200 µm. In this case, the location of the wafer transformation layer 15 is changed according to the thickness of the epitaxial film 3, and the layer 15 is formed at least in the epitaxial film 3, at the boundary between the epitaxial film 3 and the GaN wafer 1, or in the GaN wafer 1. Note that FIG. 1F shows an example in which the wafer transformation layer 15 is formed at the boundary between the epitaxial film 3 and the GaN wafer 1.

Here, as will be described later, at least a part of the GaN wafer 1 in the processed wafer 10 is recycled as the recycle wafer 40. Therefore, the wafer transformation layer 15 may be preferably formed inside the epitaxial film 3 or at the boundary between the epitaxial film 3 and the GaN wafer 1. When the wafer transformation layer 15 is formed inside the GaN wafer 1, the wafer transformation layer 15 may be preferably formed on one surface 1a side of the GaN wafer 1.

When the wafer transformation layer 15 is formed inside the epitaxial film 3, the wafer transformation layer 15 is formed inside the $n^+$ type epitaxial layer 3a instead of the $n^-$ type epitaxial layer 3b constituting the semiconductor element. In the following, the portion of the processed wafer 10 on the one surface 10a side of the wafer transformation layer 15 is referred to as the chip formation wafer 30, and the portion of the processed wafer 10 on the other surface 10b side of the wafer transformation layer 15 is referred to as the recycle wafer 40.

Figure 1G:
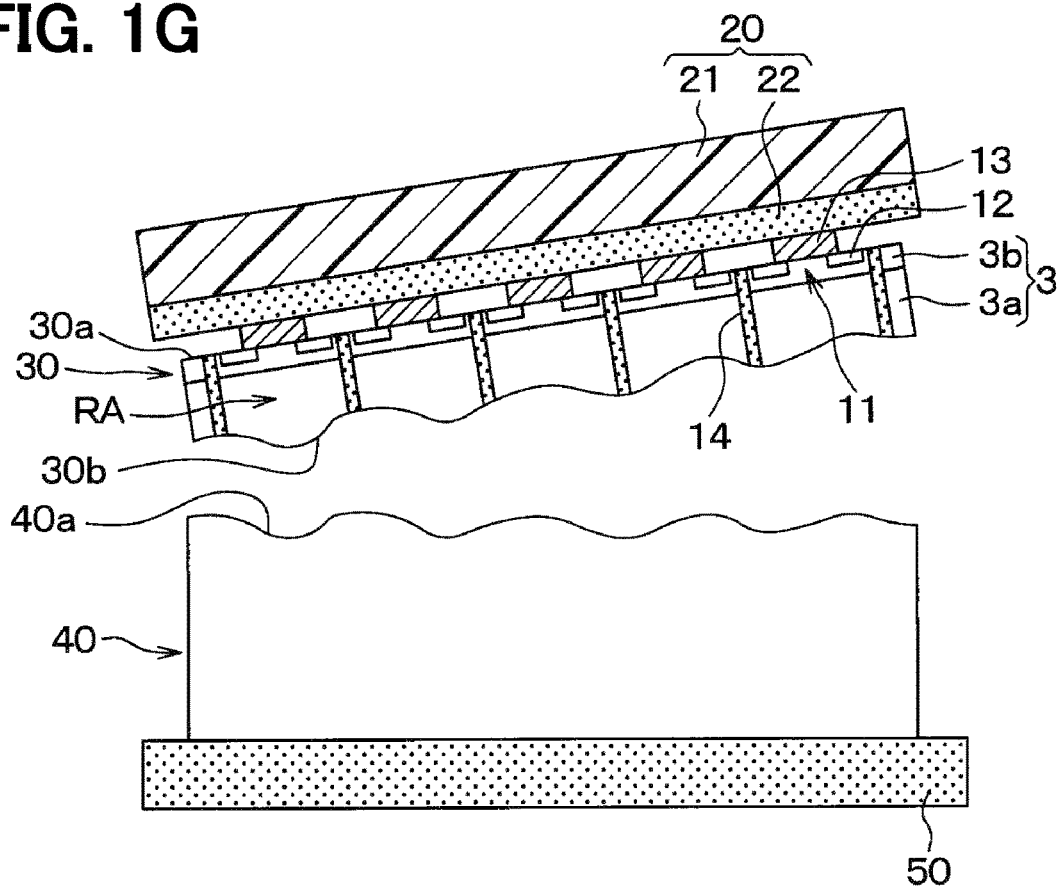
FIG. 1G is a cross-sectional view illustrating a manufacturing process of the semiconductor device subsequent to FIG. 1F.

Next, as shown in FIG. 1G, the auxiliary member 50 is arranged on the other surface 10b side of the processed wafer 10. Although the auxiliary member 50 is shown in a simplified manner in FIG. 1G, for example, similar to the holding member 20, the auxiliary member 50 includes a base material and an adhesive whose adhesive strength can be changed. In this case, the base material in the auxiliary member 50 is made of, for example, glass, a silicon substrate, ceramics, etc., and the adhesive in the auxiliary member 50 is made of, for example, an ultraviolet curable resin, wax, double-sided tape, or the like. Then, the holding member 20 and the auxiliary member 50 are gripped and a tensile force or the like is applied in the thickness direction of the processed wafer 10, and the wafer is divided into the chip formation wafer 30 and the recycle wafer 40 at the wafer transformation layer 15 as a boundary (that is, the starting point of branching). In the following, the surface of the chip formation wafer 30 on which the one surface side element component 11 is formed is designated as the one surface 30a, and the divided surface side of the chip formation wafer 30 is referred to as the other surface 30b. The divided surface side of the recycle wafer 40 will be described as one surface 40a. Further, in each of the drawings after FIG. 1G, the wafer transformation layer 15 and the like remaining on the other surface 30b of the chip formation wafer 30 and the one surface 40a of the recycle wafer 40 are appropriately not shown.

Figure 1H:
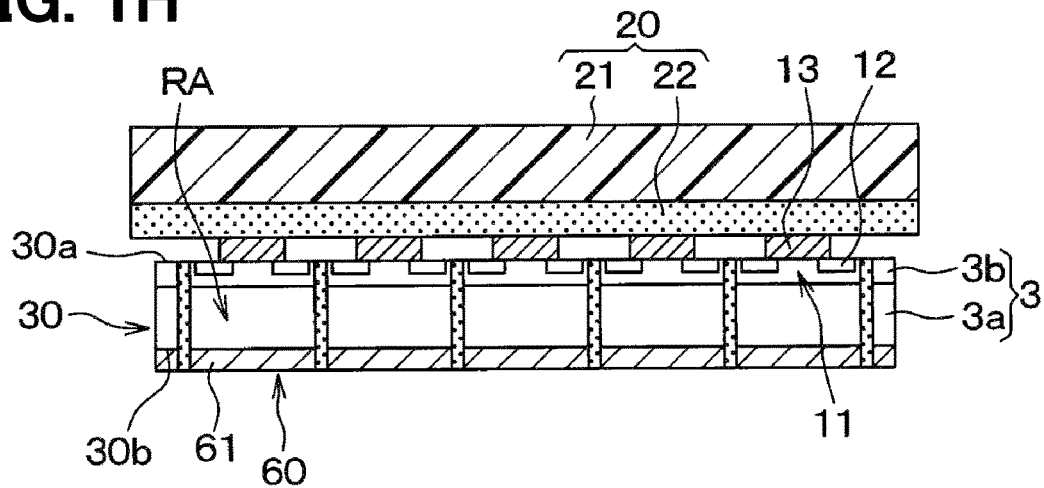
FIG. 1H is a cross-sectional view illustrating a manufacturing process of the semiconductor device subsequent to FIG. 1G.

After that, as shown in FIG. 1H, a general semiconductor manufacturing process is performed, and a step is performed for forming the other surface side element component 60 of the semiconductor element such as the metal film 61 constituting the back surface electrode is formed on the other surface 30b of the chip formation wafer 30.

Before the step of forming the other surface side element component 60, a step of flattening the other surface 30b of the chip formation wafer 30 by a CMP (abbreviation of chemical mechanical polishing) method or the like may be performed as necessary. FIG. 1H shows a view when the other surface 30b of the chip formation wafer 30 is flattened. Further, after performing the step of forming the other surface side element component 60, heat treatment such as laser annealing or the like may be performed in order to make ohmic contact between the metal film 61 and the other surface 30b of the chip formation wafer 30 as necessary.

Figure 1I:
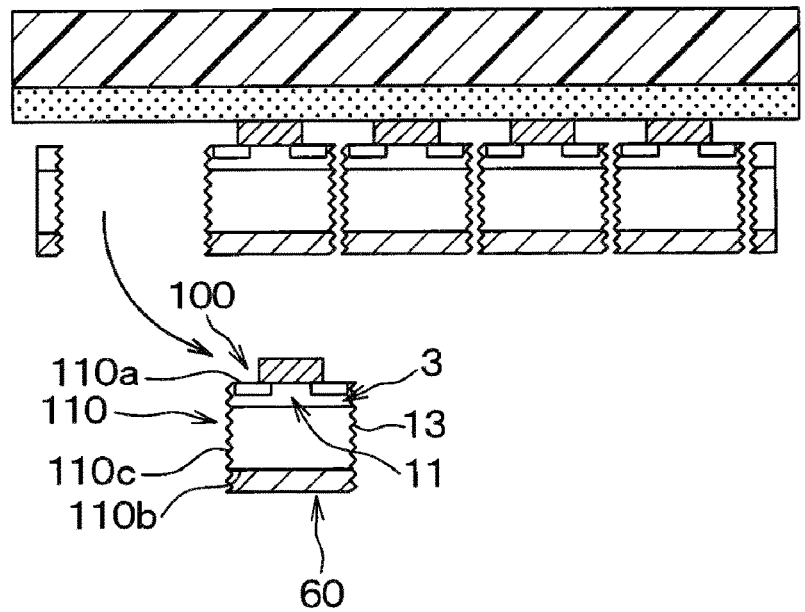
FIG. 1I is a cross-sectional view illustrating a manufacturing process of the semiconductor device subsequent to FIG. 1H.

Subsequently, as shown in FIG. 1I, the holding member 20 is expanded, and the chip formation regions RA are divided at the chip transformation layer 14 as a boundary (that is, the starting point of branching). After that, the adhesive force of the adhesive 22 is weakened by heat treatment or irradiation with light, and the semiconductor chip 100 is picked up. As a result, the semiconductor chip 100 is manufactured. Before dividing the chip forming regions RA, if necessary, a slit or the like may be formed at the boundary of each chip formation region RA in the metal film 61 so as to easily divide the metal film 61 for each chip formation region RA. In this case, in the step of FIG. 1H, a metal mask covering a portion to be divided may be prepared so that the metal film 61 is not formed on the to-be-divided portion.

Further, the semiconductor chip 100 manufactured as described above includes a chip formation substrate 110 having one surface 110a, another surface 110b on the opposite side to the one surface, and a side surface 110c connecting the one surface 110a and the other surface 110b. Further, the chip formation substrate 110 has an epitaxial film 3 made of GaN, the one surface side element component 11 is formed on the one surface 110a side, and the other surface side element component 60 is formed on the other surface 110b side. Since the semiconductor chip 100 is configured by being divided at the chip transformation layer 14 as a boundary, the chip transformation layer 14 remains on the side surface 110c. In this case, the chip transformation layer 14 is a layer in which gallium and nitrogen are separated and gallium is deposited, and is in a state where minute irregularities are formed. Therefore, in the manufacturing method of the present embodiment, the semiconductor chip 100 that is easy to handle is manufactured.

Figure 1J:
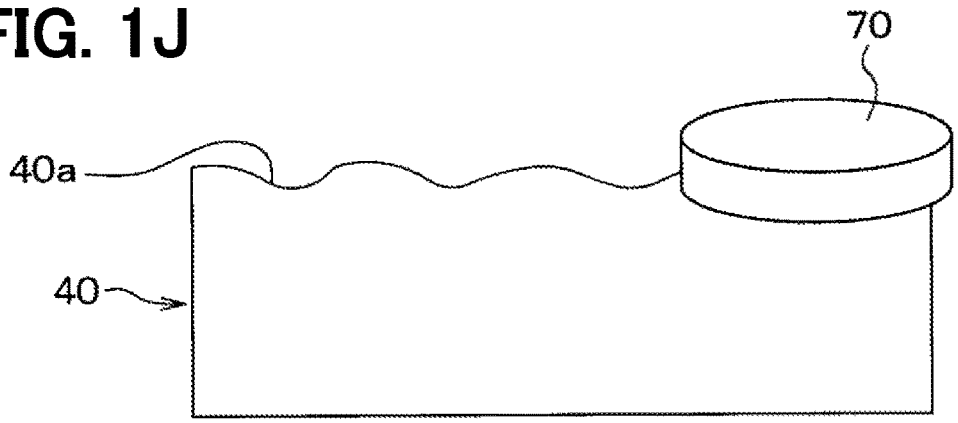
FIG. 1J is a cross-sectional view illustrating a manufacturing process of the semiconductor device subsequent to FIG. 1I.

Further, as shown in FIG. 1J, the one surface 40a of the recycle wafer 40 configured in FIG. 1G is flattened by performing a CMP method using a polishing apparatus 70 or the like on the one surface 40a. Then, the flattened recycle wafer 40 is used as the GaN wafer 1, and the steps after FIG. 1A are performed again. As a result, the GaN wafer 1 can be used a plurality of times to form the semiconductor chip 100.

According to the present embodiment described above, the processed wafer 10 is divided into a chip formation wafer 30 and a recycle wafer 40, and the recycle wafer 40 is used again as the GaN wafer 1. Therefore, it is not necessary to newly prepare a GaN wafer 1 every time a semiconductor chip 100 is manufactured, and the GaN wafer 1 can be effectively used. Therefore, the productivity of the semiconductor chip 100 can be improved.

Further, when the wafer transformation layer 15 is formed, nitrogen generated when the wafer transformation layer 15 is formed is released via the chip transformation layer 14. Therefore, the distortion generated in each chip formation region RA can be reduced, and the occurrence of defects in the semiconductor chip 100 can be suppressed.

Further, a chip transformation layer 14 is formed between the chip formation regions RA. Then, when dividing the chip formation regions RA, the holding member 20 is expanded to divide at the chip transformation layer 14 as a boundary. Therefore, for example, the region between the chip formation regions RA can be narrowed as compared with the case where the chip formation regions RA are divided by a dicing blade or the like. Therefore, it is possible to increase the number of semiconductor chips 100 manufactured from the processed wafer 10.

When the processed wafer 10 is divided into a chip formation wafer 30 and a recycle wafer 40, a laser beam L is irradiated to form a wafer transformation layer 15, and the wafer 10 is divided into the chip formation wafer 30 and the recycle wafer 40 at the wafer transformation layer 15 as the boundary. Therefore, the manufacturing time can be shortened as compared with the case where the thickness is reduced by grinding or the like from the other surface 10b of the processed wafer 10 by the CMP method or the like.

Since the chip formation region RA are divided with the chip transformation layer 14 as a boundary, the side surface 110c of the semiconductor chip 100 has a chip transformation layer 14 and is in a state where minute irregularities are formed. Therefore, the handling of the semiconductor chip 100 can be facilitated.

Second Embodiment

A second embodiment will be described. In this embodiment, a characteristic inspection is performed with respect to the first embodiment. The remaining configuration is similar to that according to the first embodiment and will thus not be described repeatedly.

Figure 4:
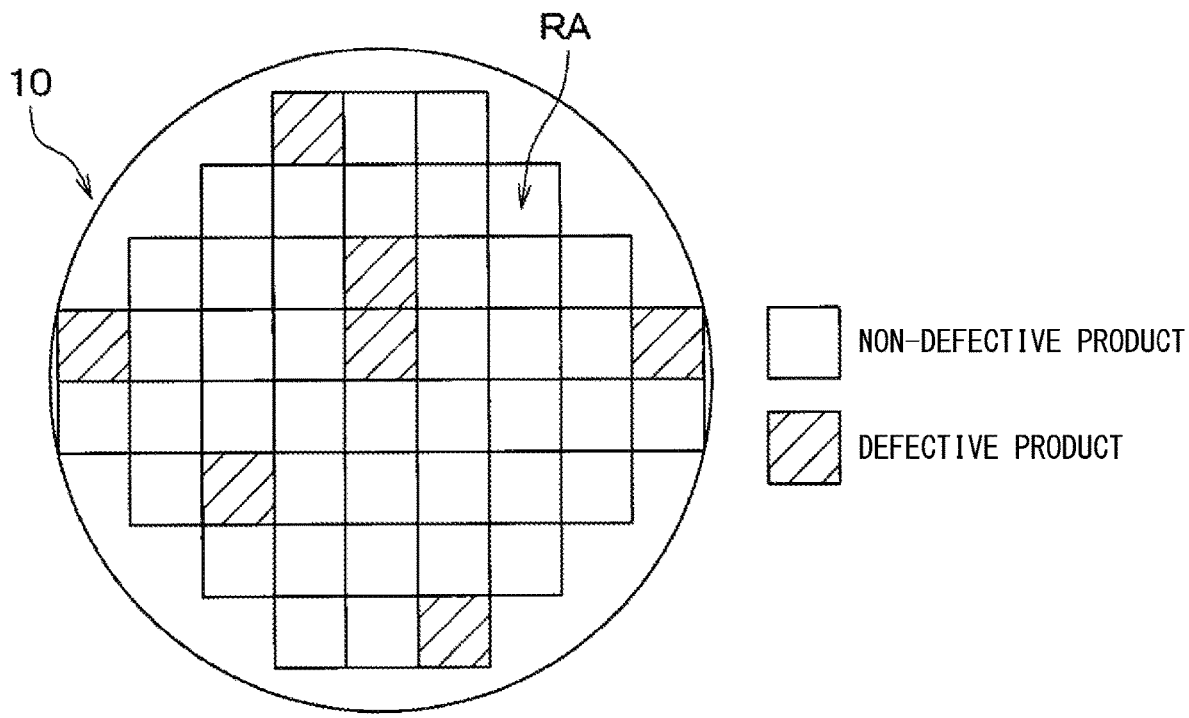
FIG. 4 is a schematic view of a processed wafer providing a chip formation region which is a defective product in the second embodiment.

In the present embodiment, after the step of forming the one surface side element component 11 of FIG. 1C, a characteristic inspection such as a WAT (abbreviation of wafer acceptance test) inspection is performed on each chip formation region RA. Then, it is determined whether the one surface side element component 11 of the semiconductor element formed in each chip formation region RA is a non-defective product or a defective product. In this case, for example, as shown in FIG. 4, a non-defective product and a defective product are determined for each chip formation region RA. In FIG. 4, the chip formation region RA determined to be a defective product is hatched.

After that, in the process of FIG. 1I, when the semiconductor chip 100 is picked up from the holding member 20, only non-defective products are picked up.

According to this, since defective products are not picked up, subsequent processes such as easy management can be simplified.

(Modification of Second Embodiment)

The modification of the second embodiment will be described below. In the second embodiment, the other surface side element component 60 such as the metal film 61 constituting the back surface electrode may not be formed in the chip formation region RA in the step of FIG. 1H, which is determined to be defective by the characteristic inspection. For example, when forming the metal film 61, a metal mask configured to cover the chip formation region RA determined to be a defective product is prepared, and the metal mask 61 is used to form the metal film 61.

Third Embodiment

A third embodiment will be described. In this embodiment, the chip formation region RA is divided by a dicing blade as compared with the first embodiment. The remaining configuration is similar to that according to the first embodiment and will thus not be described repeatedly.

Figure 5:
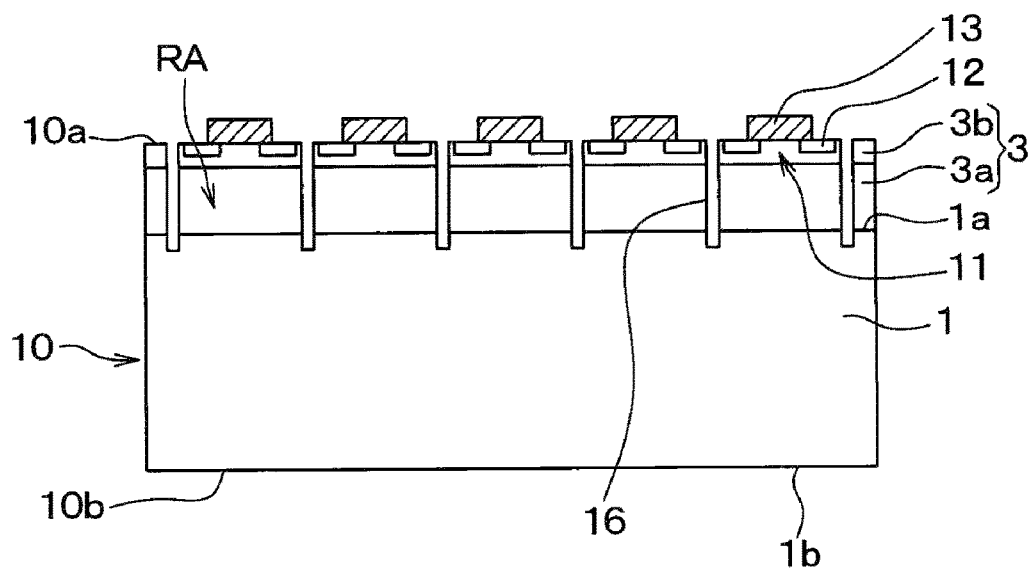
FIG. 5 is a cross-sectional view showing a manufacturing process of a semiconductor chip according to the third embodiment.

In the present embodiment, instead of forming the chip transformation layer 14 in the step of FIG. 1E, as shown in FIG. 5, the chip formation regions RA are divided by a dicing blade, and a slit 16 is formed in the outer edge including the boundary of the chip formation region RA. In this embodiment, the slit 16 corresponds to the division structure. Further, in the present embodiment, the step of arranging the holding member 20 of FIG. 1D is performed after the step of FIG. 5 is performed.

Then, in the process of FIG. 1F, the wafer transformation layer 15 that intersects the slit 16 or passes directly under the slit 16 is formed so that nitrogen when forming the wafer transformation layer 15 is released to the outside through the slit 16.

After that, in the step of FIG. 1H, a metal mask configured so that the metal film 61 is not formed in the slit 16 is prepared, and the metal film 61 is formed. That is, a metal mask that covers the slit 16 is prepared to form the metal film 61. Then, in the process of FIG. 1I, the holding member 20 is expanded to secure the space between the semiconductor chips 100, and then the semiconductor chip 100 is picked up.

As described above, even when the slit 16 is formed before the wafer transformation layer 15 is formed, the same effect as that of the first embodiment can be obtained.

Other Embodiments

The present disclosure is not limited to the above-described embodiments and may be appropriately modified.

For example, in each of the above embodiments, the epitaxial film 3 may be made of only the n⁻ type epitaxial layer 3b.

Further, in each of the above embodiments, in the process of FIG. 1H, the metal film 61 may be formed without polishing the other surface 30b of the chip formation wafer 30. For example, when an optical semiconductor element or the like is formed as a semiconductor element, by forming a concavo-convex structure on the other surface 110b side of the semiconductor chip 100, it is possible to effectively extract light from the other surface 110b side. Immediately after the processed wafer 10 is divided into the chip formation wafer 30 and the recycle wafer 40, the other surface 30b of the chip formation wafer 30 is in a state where the wafer transformation layer 15 remains, and minute irregularities are formed. Therefore, when forming the optical semiconductor element, the unevenness of the wafer transformation layer 15 may be used without polishing the other surface 30b of the chip formation wafer 30.

Further, in each of the above embodiments, in the step of forming the epitaxial film 3 of FIG. 1B, the epitaxial film may be formed on the other surface 1b side of the GaN wafer 1. According to this, for example, even when the wafer transformation layer 15 is formed in the GaN wafer 1, it becomes easy to remain a thickness equal to or more than a predetermined thickness as the recycle wafer 40, and the number of times that the recycle wafer can be recycled can be increased.

Further, in the first and second embodiments, the step of forming the chip transformation layer 14 of FIG. 1E may be performed before the step of arranging the holding member 20 of FIG. 1D. In this case, the laser beam L may be irradiated from the one surface 10a of the processed wafer 10. Here, when the laser beam L is irradiated from the one surface 10a of the processed wafer 10, the position of the condensing point of the laser beam L may vary depending on the surface electrode, the wiring pattern, or the like formed on the one surface 10a side. Therefore, it may be preferable to irradiate the laser beam from the other surface 10b of the processed wafer 10.

Further, the above embodiments may be combined together as appropriate. For example, the second embodiment may be combined with the third embodiment to perform a characteristic inspection or the like while forming the slit 16.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing a semiconductor chip on which a semiconductor element is formed, the method comprising:
    preparing a gallium nitride wafer which is made of gallium nitride and has a first surface and a second surface;
    forming an epitaxial film on the first surface of the gallium nitride wafer to define a surface of the epitaxial film as a third surface of a processed wafer having a plurality of chip formation regions on the third surface, and to define a surface of a gallium nitride wafer side of the processed wafer as a fourth surface of the processed wafer;
    forming an element component of the semiconductor element on the third surface in each of the plurality of chip formation regions;
    arranging a holding member, via a gate electrode, on the third surface of the processed wafer;
    forming a division structure for dividing the chip formation regions;
    after forming the division structure, irradiating an inside of the processed wafer with a laser beam from the fourth surface of the processed wafer, and forming a wafer transformation layer by separating a nitrogen atom from a gallium atom and discharging the nitrogen atom from the division structure along a surface direction of the processed wafer;
    after the irradiating of the inside of the processed wafer, dividing the processed wafer at the wafer transformation layer as a boundary to divide the processed wafer into a chip formation wafer on the third surface of the processed wafer and a recycle wafer on the fourth surface of the processed wafer;
    forming an element component of the semiconductor element on a fifth surface of the chip formation wafer from which the recycle wafer is divided; and
    after the forming of the element component on the fifth surface, retrieving the semiconductor chip from the chip formation wafer, wherein:
    the forming of the division structure includes:
        irradiating the laser beam from the fourth surface of the processed wafer to form a chip transformation layer in an outer periphery of each chip formation region by separating the nitrogen atom from the gallium atom; and
        before retrieving the semiconductor chip, expanding the holding member along the surface direction of the chip formation wafer to divide the chip formation regions at the chip transformation layer as a boundary, and
    the division structure is formed from an inside of the gallium nitride wafer to penetrate the epitaxial film and reach the third surface of the processed wafer.

2. The method for manufacturing the semiconductor chip according to claim 1, wherein:
    the forming of the division structure includes: forming a slit for dividing the chip formation regions by a dicing blade from the third surface of the processed wafer.

3. The method for manufacturing the semiconductor chip according to claim 1, wherein:
    in the forming of the division structure and the forming of the wafer transformation layer, the division structure and the wafer transformation layer are formed to intersect the division structure and the wafer transformation layer.

4. The method for manufacturing the semiconductor chip according to claim 1, further comprising:
    after forming the third surface element component, performing a characteristic inspection on each of the chip formation regions, wherein:
    in the retrieving of the semiconductor chip, only the semiconductor chip determined to be a non-defective product in the characteristic inspection is retrieved.

5. The method for manufacturing the semiconductor chip according to claim 4, wherein:
    in the forming of the fifth surface element component, the fifth surface element component is formed only in the chip formation region determined to be the non-defective product in the characteristic inspection.

6. A semiconductor chip comprising:
    an epitaxial film made of gallium nitride;
    a semiconductor element disposed in the epitaxial film;
    a chip formation substrate including the epitaxial film and having a first surface, a second surface opposite to the first surface, and a side surface connecting the first surface and the second surface; and
    a convex and a concavity on the side surface.

* * * * *